(12) United States Patent
Kim et al.

(10) Patent No.: US 6,627,821 B2
(45) Date of Patent: Sep. 30, 2003

(54) CIRCUIT BOARD AND METHOD OF MANUFACTURING THEREFOR

(75) Inventors: Yong-Jun Kim, Seongnam (KR); Dong-sik Shim, Seoul (KR); Sang-goog Lee, Incheon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 52 days.

(21) Appl. No.: 09/751,844

(22) Filed: Jan. 2, 2001

(65) Prior Publication Data

US 2001/0015684 A1 Aug. 23, 2001

(30) Foreign Application Priority Data

Dec. 30, 1999 (KR) ............................................. 99-66028
Nov. 3, 2000 (KR) ......................................... 2000-65256

(51) Int. Cl.[7] ................................................ H05K 1/03
(52) U.S. Cl. ....................................... 174/255; 174/261
(58) Field of Search ................................. 174/260, 261, 174/267, 255; 361/753

(56) References Cited

U.S. PATENT DOCUMENTS

| | | | | | |
|---|---|---|---|---|---|
| 3,801,388 | A | * | 4/1974 | Akiyama et al. | ............... 156/3 |
| 4,000,054 | A | * | 12/1976 | Marcantonio | ............... 174/256 |
| 4,141,055 | A | * | 2/1979 | Berry et al. | ............... 174/253 |
| 4,899,439 | A | * | 2/1990 | Potter et al. | ............... 174/255 |
| 5,030,935 | A | * | 7/1991 | Williams et al. | ............. 333/246 |
| 5,665,525 | A | * | 9/1997 | Pienimaa | ..................... 430/315 |
| 5,677,515 | A | * | 10/1997 | Selk et al. | .................... 174/255 |
| 5,763,824 | A | * | 6/1998 | King et al. | ............. 174/35 GC |
| 5,847,317 | A | * | 12/1998 | Phelps | .................... 174/35 GC |
| 6,115,262 | A | * | 9/2000 | Brunner et al. | .............. 174/260 |
| 6,229,404 | B1 | * | 5/2001 | Hatanaka | ..................... 257/698 |
| 6,423,907 | B1 | * | 7/2002 | Haba et al. | .................. 174/261 |

FOREIGN PATENT DOCUMENTS

| | | |
|---|---|---|
| JP | 52-91171 | 8/1977 |
| JP | 7-221464 A | 8/1995 |
| JP | 11-329263 A | 11/1999 |
| JP | 11-340709 A | 12/1999 |

* cited by examiner

*Primary Examiner*—David L. Talbott
*Assistant Examiner*—Jeremy Norris
(74) *Attorney, Agent, or Firm*—Sughrue Mion, PLLC

(57) ABSTRACT

A circuit board having a dielectric substrate, a grounding surface formed on at least one surface of the dielectric substrate, and transmission lines formed on one surface of the dielectric substrate for transmitting electrical signals. At least a portion of each of the transmission lines is isolated from an upper surface of the dielectric substrate to reduce the effective permittivity between the transmission lines and the grounding surface and a dielectric loss therebetween. In a method of manufacturing a circuit board, first, a sacrificial layer is formed on a dielectric substrate. Next, supporter patterns and transmission line patterns are formed by patterning the sacrificial layer. Then, supporters and transmission lines are formed in the supporter patterns and transmission line patterns, respectively. Following this, the sacrificial layer is removed so that the transmission lines are isolated from the upper surface of the dielectric substrate. Thereafter, a grounding surface is formed on at least one surface of the dielectric substrate.

8 Claims, 8 Drawing Sheets

CIRCUIT BOARD AND METHOD OF MANUFACTURING THEREFOR

BACKGROUND OF THE INVENTION

1. Field of the Invention

The present invention relates to a circuit board and a manufacturing method therefor and, more particularly, to a circuit board capable of minimizing dielectric loss and distortion in a transmission signal during transmission of high frequency signals or high data transmission, and a manufacturing method therefor.

2. Description of the Related Art

In general, the driving speed of chips such as central processing units (CPUs) used in the communications and computer fields has already approached GHz units. However, circuit boards, on which these chips are mounted and electrically or optically connected to each other, operate at speeds that are significantly lower than the driving speed of chips. The circuit boards have single-layer or multilayered structures.

Figure 1:
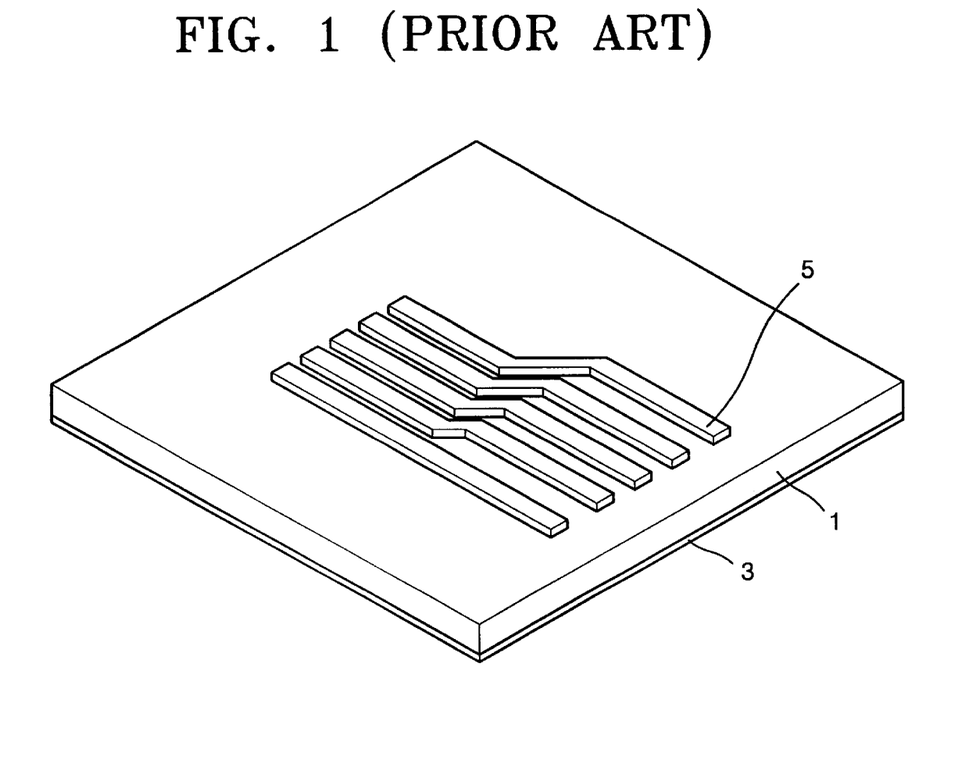
FIG. 1 is a perspective view schematically illustrating a conventional circuit board.

Referring to FIG. 1, a conventional circuit board includes a dielectric substrate 1, a grounding surface 3 which is installed on one surface of the dielectric substrate 1 and formed of a conductive metal, and a transmission line 5 which is installed on the other surface of the dielectric substrate 1 and formed of a conductive metal for transmitting signals between components mounted on a chip or the like. The dielectric substrate 1 is formed of a material having significantly high permittivity compared to air, for example, FR4/epoxy, ceramic, or TEFLON® The transmission line 5 and grounding surface 3 are formed on the dielectric substrate 1 by compression firing or the like. In this case, the electrical characteristics of the transmission line 5 depend on the electrical characteristics of the dielectric substrate 1 besides the material and structure of the transmission line 5. In the circuit board having such a structure, the transmission line 5 directly contacts the dielectric substrate 1, so that a large amount of stray capacitance or dielectric loss is generated.

Figure 2:
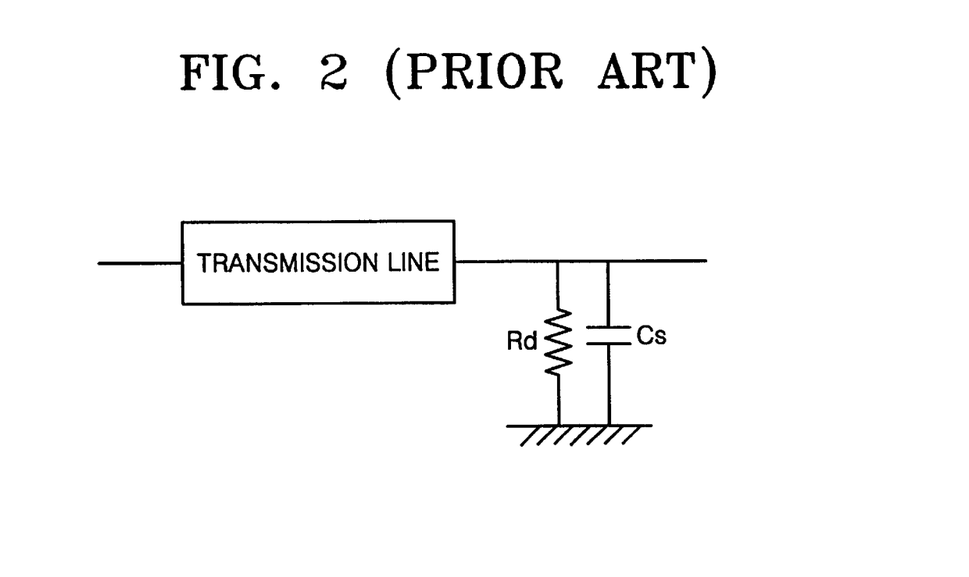
FIG. 2 is an equivalent circuit diagram of the circuit board of FIG. 1.

FIG. 2 is a schematic equivalent circuit diagram of the circuit board of FIG. 1. Referring to FIGS. 1 and 2, the dielectric substrate 1 having a predetermined permittivity $\epsilon_s$ acts as a capacitor having an electrostatic capacitance $C_s$. The electrostatic capacitance $C_s$ is referred to as stray capacitance. In this case, as the permittivity $\epsilon_s$ of the dielectric substrate 1 becomes high, a signal transmitted via a transmission line is considerably bypassed by the bypassing of a high frequency signal and high-speed transmission data. Thus, loss of an electrical signal and distortion of data are caused during transmission of high frequency components and high-speed data transmission. A resistance Rd denotes a virtual loss due to dielectric loss.

Transmission of a high frequency signal is interpreted according to the wave theory. The permittivity $\epsilon_s$ of the dielectric substrate is divided into a real part permittivity $\epsilon_{s1}$ and an imaginary part permittivity $\epsilon_{s2}$. That is, $\epsilon_s$ is equal to $\epsilon_{s1} + j\epsilon_{s2}$. Also, since a transmission signal is expressed as $Ae^{-jkz}$, $k = j\omega\sqrt{\mu\epsilon_s}$, there are terms that are lost by the imaginary part permittivity $\epsilon_{s2}$ of the permittivity $\epsilon_s$. Such a loss in a transmission signal is referred to as dielectric loss, which causes loss in an electrical signal of a high frequency component.

Also, in a conventional circuit board, the interference is increased by the influence of a surface wave from the surface of a dielectric substrate in contact with transmission lines.

SUMMARY OF THE INVENTION

To solve the above problem, an objective of the present invention is to provide a circuit board in which the effective permittivity between a transmission line and a grounding surface is lowered by isolating at least one part of each of the transmission lines from an upper surface of a dielectric substrate, leading to minimized dielectric loss and distortion in a transmission signal during transmission of a high frequency signal or high-speed data transmission, and a manufacturing method therefor.

The above objective of the present invention is achieved by a circuit board having a dielectric substrate, a grounding surface formed on at least one surface of the dielectric substrate, and transmission lines formed on one surface of the dielectric substrate for transmitting electrical signals, wherein at least a portion of each of the transmission lines is isolated from an upper surface of the dielectric substrate to reduce the effective permittivity between the transmission lines and the grounding surface and reduce dielectric loss.

The above objective of the present invention is also achieved by a circuit board having a dielectric substrate, a grounding surface formed on at least one surface of the dielectric substrate, and transmission lines formed on one surface of the dielectric substrate for transmitting electrical signals, wherein at least a portion of each of the transmission lines is isolated from the upper surface of the dielectric substrate to reduce the effective permittivity between the transmission lines and the grounding surface and reduce dielectric loss, and a cap covers the transmission lines, one end of the cap being grounded to the grounding surface.

The above objective of the present invention is achieved by a method of manufacturing a circuit board, including: forming a sacrificial layer of a predetermined thickness on a dielectric substrate; forming supporter patterns and transmission line patterns by patterning the sacrificial layer, and forming supporters and transmission lines in the supporter patterns and transmission line patterns; removing the sacrificial layer so that the transmission lines are isolated from an upper surface of the dielectric substrate; and forming a grounding surface on at least one surface of the dielectric substrate.

The above objective of the present invention is also achieved by a method of manufacturing a circuit board, including: coating a dielectric substrate with a first polymer to a predetermined height, depositing an adhesive layer and a seed layer on the first polymer, and patterning the seed layer, thereby forming support corresponding regions, pad corresponding regions and ground corresponding regions; coating the patterned seed layer with a second polymer, and patterning and plating the second polymer, thereby forming a metal layer for transmission lines; anisotropically etching exposed portions of the first polymer after removing the second polymer and etching the adhesive layer; and forming supporters by isotropically etching a portion of the first polymer below the metal layer for transmission lines.

BRIEF DESCRIPTION OF THE DRAWINGS

The above objective and advantages of the present invention will become more apparent by describing in detail preferred embodiments thereof with reference to the attached drawings, in which.

DETAILED DESCRIPTION OF THE PREFERRED EMBODIMENTS

Figure 3:
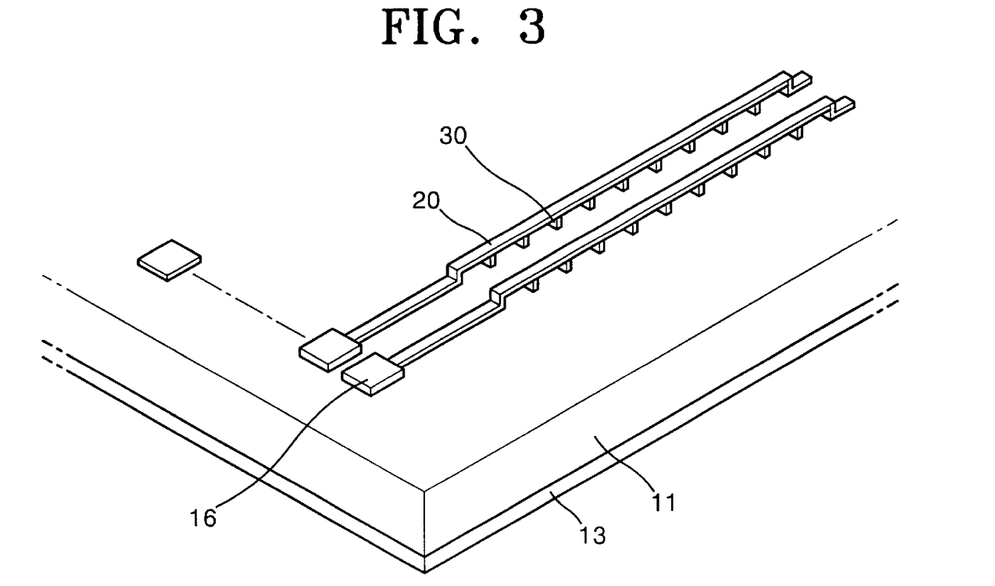
FIG. 3 is a perspective view schematically illustrating a circuit board according to a first embodiment of the present invention.

A circuit board according to the present embodiment can be a single-layer board or a multi-layered board which is a stack of a plurality of dielectric substrates. FIG. 3 shows a single-layer circuit board as an example.

Referring to FIG. 3, a circuit board according to a first embodiment of the present invention includes a dielectric substrate 11, a grounding surface 13 which is installed on at least one surface of the dielectric substrate 11 and formed of a conductive metal, and transmission lines 20 aligned on one surface of the dielectric substrate 11, at least a portion of each of the transmission lines being isolated from the upper surface of the dielectric substrate 11. A plurality of supporters 30 for supporting the transmission lines 20 are provided between the dielectric substrate 11 and the transmission lines 20 so that the transmission lines 20 are isolated a predetermined distance apart from the upper surface of the dielectric substrate 11.

The dielectric substrate 11 is made of FR4/epoxy, ceramic, or TEFLON®. The grounding surface 13 is formed on one surface of the dielectric substrate 11 by compression firing or the like, and prevents an electrical signal applied to the transmission lines 20 from being affected by peripheral apparatuses.

The transmission lines 20 are supported by the supporters 30 and thus isolated a predetermined distance from the upper surface of the dielectric substrate 11. In this case, it is preferable that the transmission lines 20 are formed of a metal having excellent electrical conductivity, for example, gold (Au), silver (Ag), copper (Cu) or aluminum (Al). When the transmission lines 20 are disposed isolated from the upper surface of the dielectric substrate 11 as described above, the permittivity of an air layer between the dielectric substrate 11 and the transmission lines 20 is reflected in the effective permittivity $\epsilon_{eff}$ between the transmission lines 20 and the grounding surface 13. Thus, the effective permittivity $\epsilon_{eff}$ between the transmission lines 20 and the grounding surface 13 can be significantly lower compared to the permittivity $\epsilon_s$ of a conventional circuit board described above with reference to FIGS. 1 and 2.

Accordingly, the transmission lines 20 can reduce dielectric loss and stray capacitance that can be caused during transmission of a high-frequency or high-speed digital signal from or to components (not shown) installed on the circuit board. The transmission lines 20 as described above can be used for signal transmission between the CPU of a computer and a memory including a cache memory, high frequency signal transmission in communication equipment, and electrical signal transmission in optical transmission and reception equipment. In this case, the transmission lines 20 can be bonded with electrical parts by a bonding pad 16 connected to the transmission lines 20.

The supporters 30 support the transmission lines 20 so as not to contact the dielectric substrate 11, and are formed of a dielectric material. In particular, it is preferable that the supporter 30 is formed of a polymer to reduce electrical loss.

Figure 4:
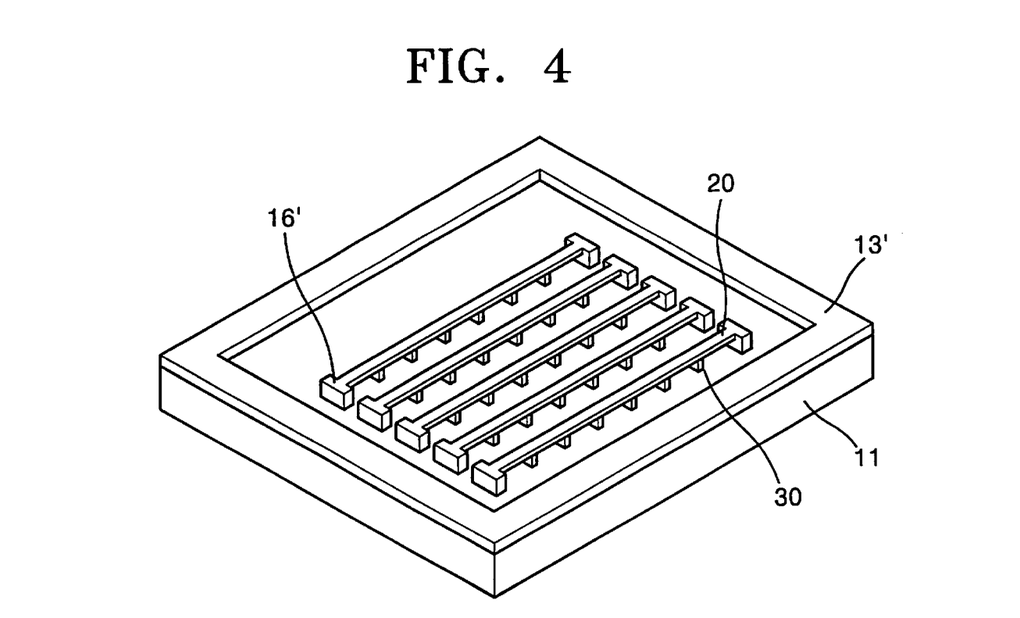
FIG. 4 is a perspective view schematically illustrating a circuit board according to a second embodiment of the present invention.

In a circuit board according to a second embodiment of the present invention, as shown in FIG. 4, a grounding surface 13' and transmission lines 20 can both be provided on one surface of the dielectric substrate 11. Also, bonding pads 16' can be formed at both ends of each of the transmission lines 20. Here, the bonding pads 16' can be formed of a dielectric material instead of metal.

Figure 5:
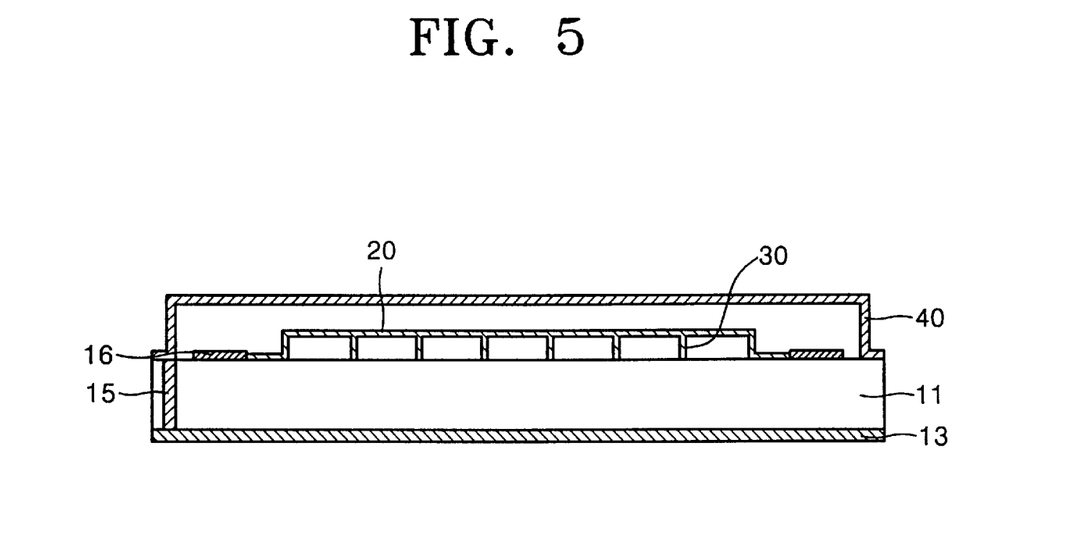
FIG. 5 is a cross-sectional view schematically illustrating a circuit board according to a third embodiment of the present invention.
Figure 6:
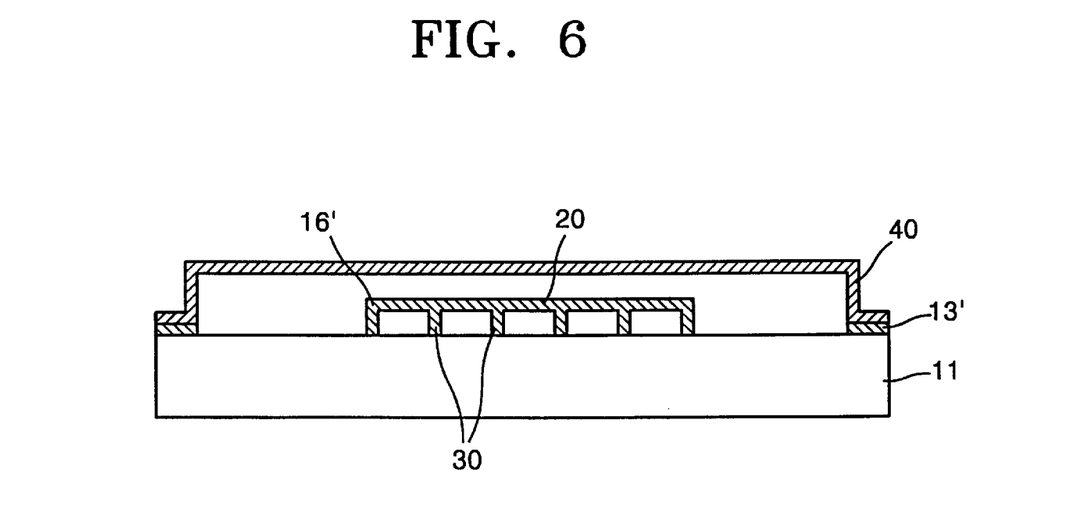
FIG. 6 is a cross-sectional view schematically illustrating a circuit board according to a fourth embodiment of the present invention.

In circuit boards according to third and fourth embodiments of the present invention, as shown in FIGS. 5 and 6, a cap 40 for covering the transmission lines 20 is further included.

The cap 40, one end of which is grounded to the grounding surface 13, lowers the effective permittivity $\epsilon_{eff}$, and shields the transmission lines 20 from external impurities or electromagnetic waves. In this case, as shown in FIG. 5, when the transmission lines 20 are formed on one surface of the dielectric substrate 11, and the grounding surface 13 is formed on the other surface thereof, a conducting electrode 15 is further provided in order to ground the cap 40 to the grounding surface 13. One end of the conducting electrode 15 is connected to the cap 40, and the other end is connected to the grounding surface 13 through the dielectric substrate 11.

Referring to FIG. 6, a circuit board according to a fourth embodiment of the present invention has a structure where a grounding surface 13' and transmission lines 20 are both provided on one surface of a dielectric substrate 11. In this case, the conducting electrode 15 (FIG. 5) formed through the dielectric substrate 11 is not required.

As described above, in a case where the transmission lines 20 are covered by the cap 40, the effective permittivity $\epsilon_{eff}$ can be reduced by filling the cap 40 with air. In particular, the effective permittivity $\epsilon_{eff}$ can be further reduced by maintaining the inside of the cap 40 in a vacuum state. That is, since the permittivity of a vacuum state is lower than that of air, dielectric loss is further reduced in a case where the inside of the cap 40 is maintained in a vacuum state than in a case where air is filled between the transmission lines 20 and the dielectric substrate 11.

Figure 7A:
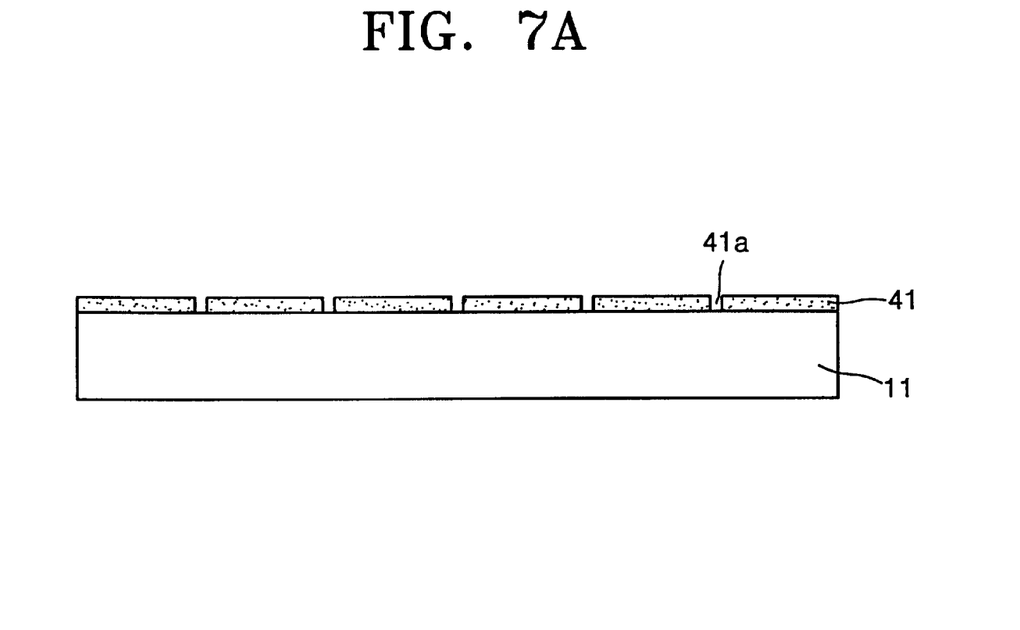
FIGS. 7A through 7E are cross-sectional views illustrating a method of manufacturing a circuit board according to an embodiment of the present invention.

A method of manufacturing a circuit board according to a preferred embodiment of the present invention will now be described in detail. Referring to FIG. 7A, a dielectric substrate 11 is provided, and a first sacrificial layer 41 having a predetermined height is formed on the dielectric substrate 11. Then, patterns 41a for use as supporters are formed by patterning the first sacrificial layer 41. The first sacrificial layer 41, which is to be removed after transmission lines are completely manufactured, is formed of polyimide, photoresist, or metal.

Figure 7B:
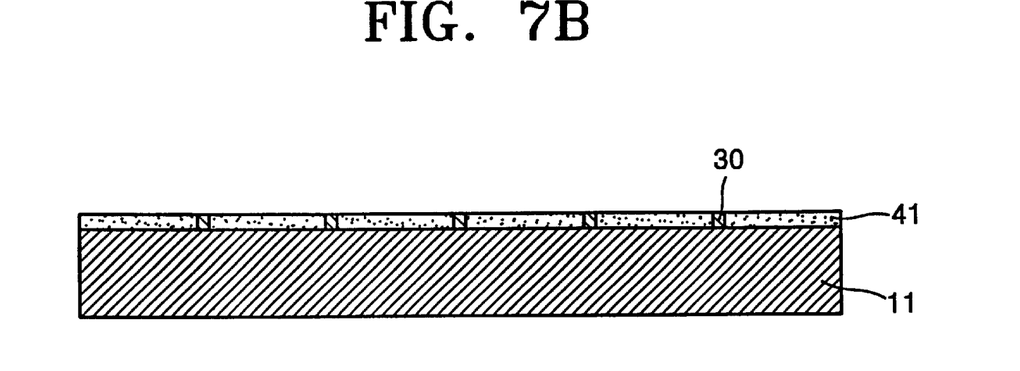

Thereafter, supporters 30 are formed in the patterns 41a, as shown in FIG. 7B. In this case, the supporters 30 are formed by deposition or plating. How the supporters 30 are formed will not be described in detail since the deposition process and the plating process are already well known.

Figure 7C:
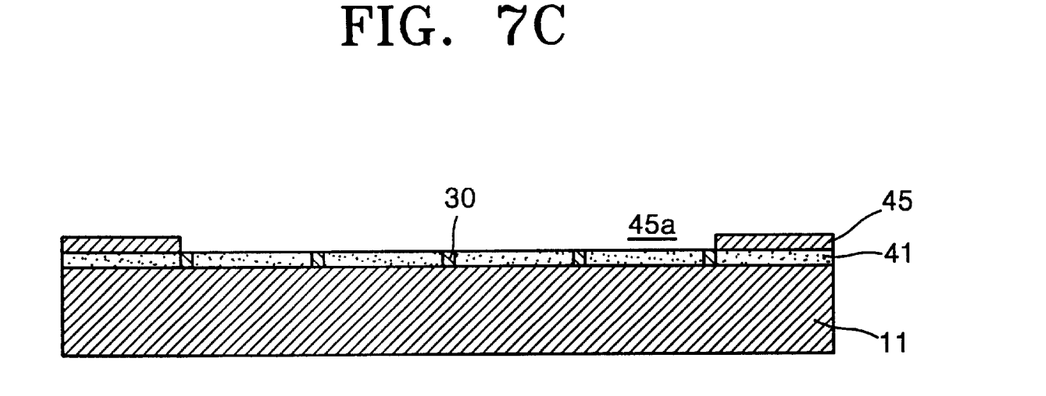
Figure 7D:
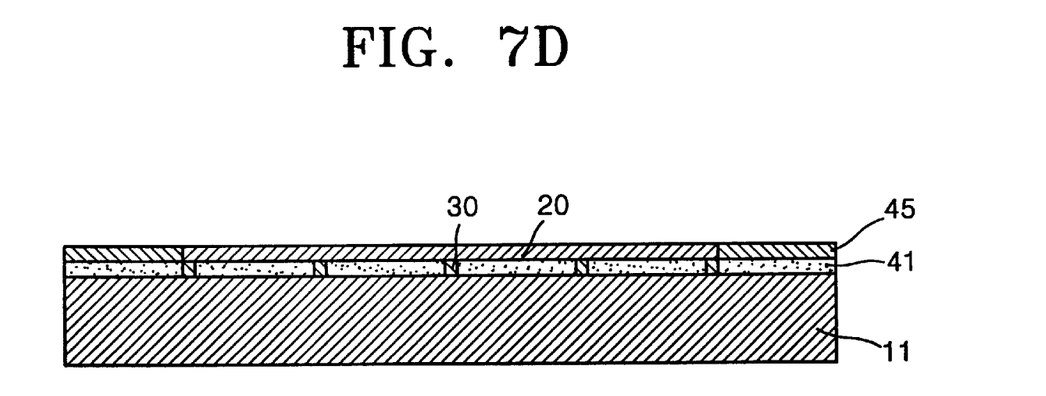

After the supporters 30 are formed, as shown in FIG. 7C, a second sacrificial layer 45 is formed on the first sacrificial layer 41, and transmission line patterns 45a are formed by patterning the second sacrificial layer 45. Next, as shown in FIG. 7D, transmission lines 20 are formed in the transmission line patterns 45a by deposition or plating.

Figure 7E:
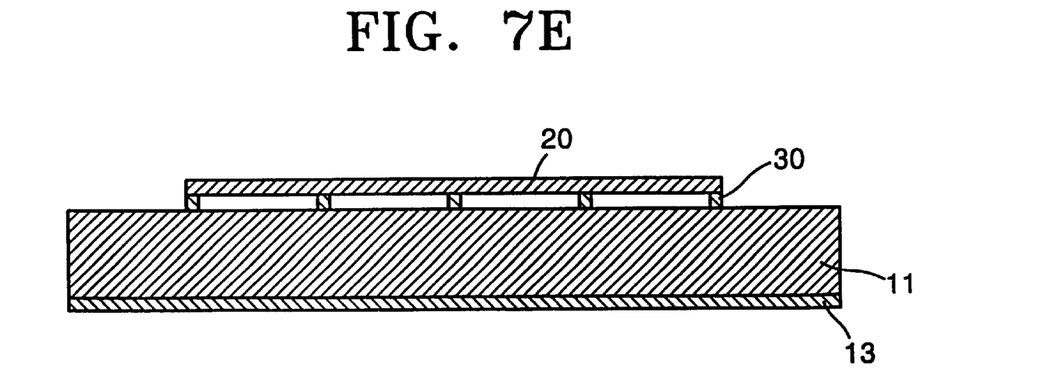

Thereafter, as shown in FIG. 7E, the first and second sacrificial layers 41 and 45 are removed to obtain the transmission lines 20 that are supported by the supporters 30 so as to be isolated from the upper surface of the dielectric substrate 11. Then, a grounding surface 13 is formed on at least one surface of the dielectric substrate 11. It is natural that the grounding surface 13 can be formed before the processes described with reference to FIGS. 7A through 7D.

Figure 8A:
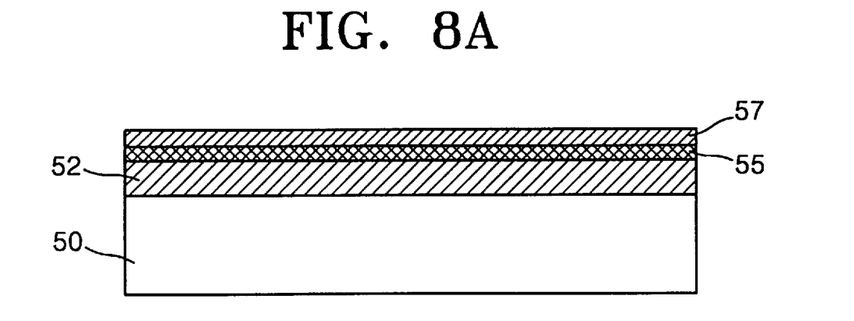
FIGS. 8A through 8H are cross-sectional views illustrating a method of manufacturing a circuit board according to another embodiment of the present invention.

A method of manufacturing a circuit board according to another preferred embodiment of the present invention will now be described with reference to FIGS. 8A through 8H. Referring to FIG. 8A, a first polymer 52 is coated to a predetermined thickness on a dielectric substrate 50, and then thermally treated. The first polymer 52, which serves as the supporter 30 upon the completion of manufacturing, is formed to the height of the supporter 30. An adhesive layer 55 and a seed layer 57 are deposited on the first polymer 52. In this case, the adhesive layer 55 must be maintained to have a predetermined or more thickness, preferably, 500–1000 A, since it serves as a route where plating is performed. Preferably, the adhesive layer 55 is formed of Ti or Cr. Also, it is preferable that the seed layer 57 is formed of Ni, Cu or Au to a thickness of 500–2000 A.

Figure 8B:
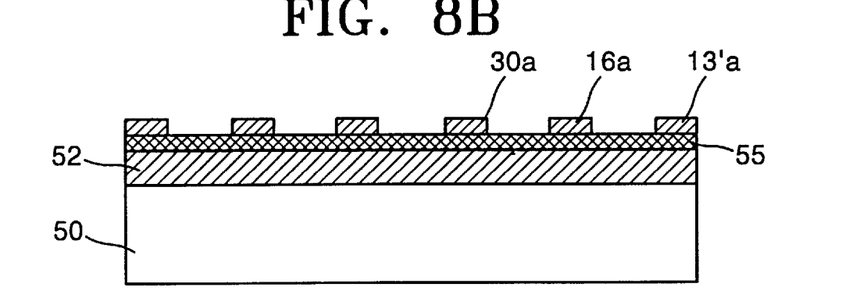
Figure 8C:
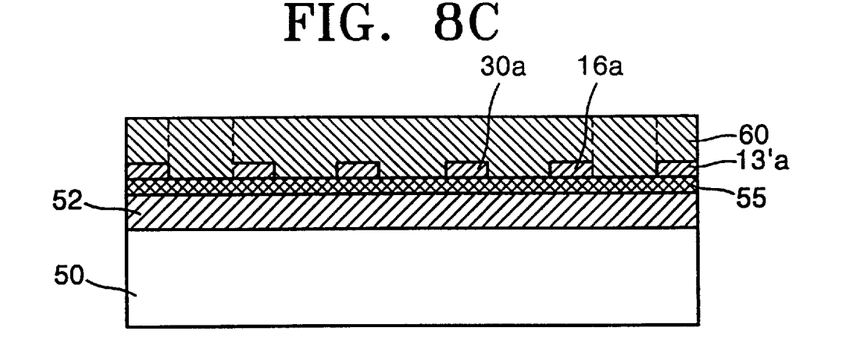
Figure 8D:
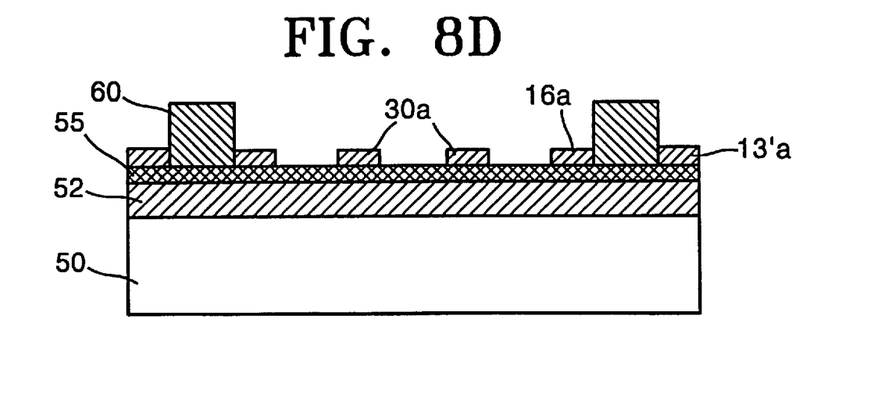
Figure 8E:
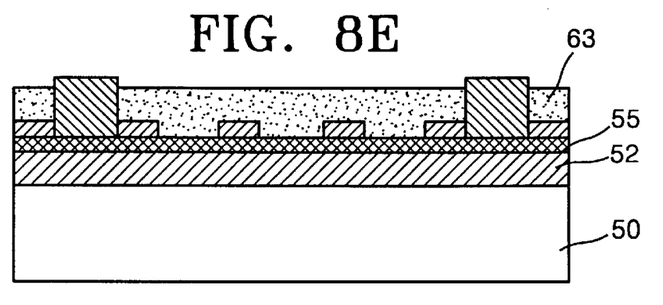
Figure 8F:
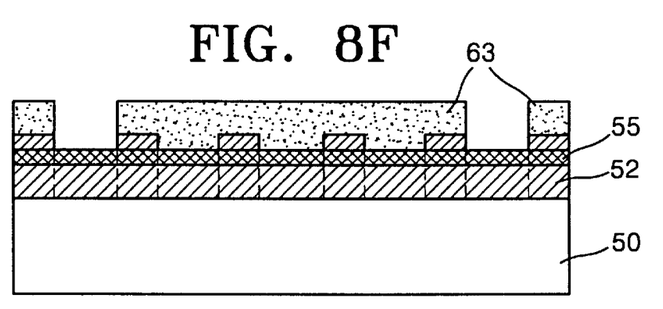
Figure 8G:
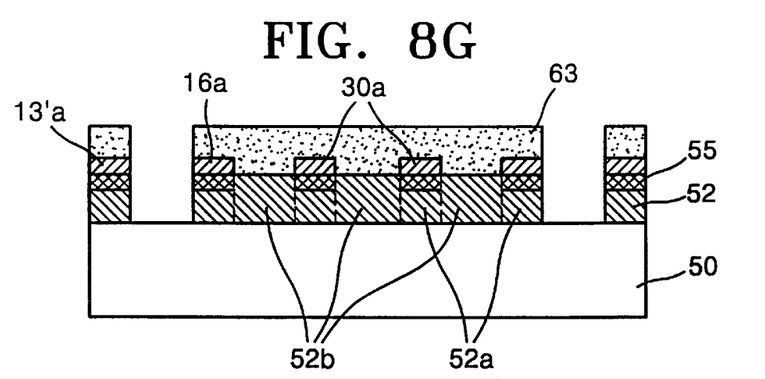
Figure 8H:
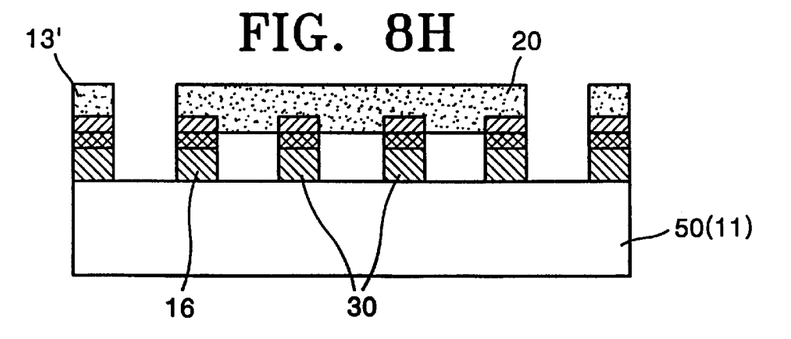

Next, as shown in FIG. 8B, ground corresponding regions 13'a, pad corresponding regions 16a and supporter corresponding regions 30a are formed by patterning the seed layer 57. As shown in FIGS. 8C and 8D, the resultant structure is coated with a second polymer 60 and patterned, thereby forming a plating mold. As shown in FIGS. 8E, 8F and 8G, the plating mold is plated with a metal layer 63 for a transmission line, the second polymer 60 used as the plating mold is removed using a dissolvent, and the adhesive layer 55 is etched. When the adhesive layer 55 is etched, the first polymer 52 thermally-treated on the dielectric substrate 50 is exposed. The exposed first polymer 52 is anisotropically etched using plasma. Thereafter, as shown in FIG. 8H, isotropical etching is performed to remove first polymer portions 52b below the metal layer 63 for a transmission line.

Figure 9:
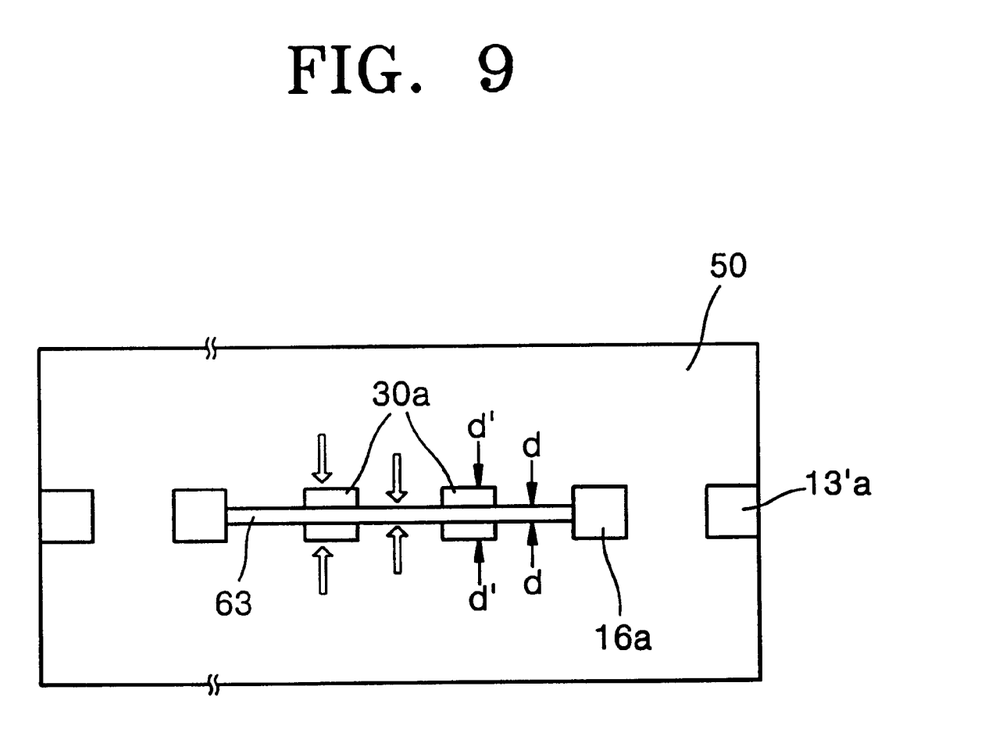
FIG. 9 is a plan view of the circuit board shown in FIG. 8G.

Referring to FIG. 9, the seed layer 57 is patterned so that each of the pad corresponding regions 16a, the supporter corresponding regions 30a and the ground corresponding regions 13'a has a width (d') that is greater than the width (d) of the metal layer 63 for a transmission line. The seed layer 57 serves as an etch mask during the anisotropic etching process, so that portions below the seed layer 57 and the metal layer 63 for a transmission line are not etched. Thus, when the anisotropic etching is completed, the first polymer below the pad corresponding regions 16a, the supporter corresponding regions 30a and the ground corresponding regions 13'a is wider than that below the other regions.

This patterning of the seed layer 57 is in consideration of the fact that the first polymer 52 below the pad corresponding regions 16a, the supporter corresponding regions 30a and the ground corresponding regions 13'a is also etched during the isotropic etching. In this case, the first polymer below the pad corresponding regions 16a, the supporter corresponding regions 30a and the ground corresponding regions 13'a is referred to as a non-etch polymer region 52a, and the first polymer below the other regions is referred to as an etch polymer region 52b. Accordingly, when the portions below the metal layer 63 for a transmission line are isotropically etched at the same speed, since the non-etch polymer regions 52a are wider than the etch polymer regions 52b (that is, d'>d), the etch polymer regions 52b are etched in both directions (that is, directions indicated by arrows of FIG. 9) and thus completely removed, but the non-etch polymer regions 52a are not completely etched and thus remain. These remaining portions after etching are the pads 16, the supporters 30 and the grounding surface 13'.

As described above, the seed layer 57 is patterned in consideration of the direction or speed of isotropic etching so that the regions have their desired sizes upon completion of etching. In this way, the supporters 30 made of polymer are formed. As described above, when the supporters are formed of polymer, the manufacturing costs are cheap, and only one plating process is required, so that the manufacturing process is simplified.

The circuit board manufacturing method according to another embodiment of the present invention refers to the case in which the grounding surface 13' and the transmission lines 20 are formed on the same surface of the dielectric substrate 11. However, this method can also be applied to the case in which the grounding surface 13' is formed on the bottom surface of the dielectric substrate 11 having no transmission lines 20 thereon. After the above-described process, a process for forming a cap 40 to cover the transmission lines shown in FIGS. 5 and 6 can be further included. Here, the inside of the cap 40 is filled with air or maintained in a vacuum state, so that the effective permittivity can be further reduced.

As described above, in circuit boards according to the present invention having such structures, an air layer is formed between each transmission line and a dielectric substrate by isolating most of each of the transmission lines from the upper surface of the dielectric substrate, so that the effective permittivity between the transmission lines and ground is significantly lowered. This leads to a minimized dielectric loss and signal distortion caused during transmission of high frequency signals and high-speed digital signals. Also, when several transmission lines are arranged closely to each other on a dielectric substrate, the circuit boards according to the present invention have high characteristic impedance compared to a conventional circuit board. In this case, prevention of interference between a dielectric substrate and a surface wave or the like can minimize the interference between transmission lines. Furthermore, a reduction of the effective permittivity as described above can increase wave velocity, leading to fast signal transmission.

It is contemplated that numerous modifications may be made to the circuit board and method of manufacturing therefor of the present invention without departing from the spirit and scope of the invention as defined in the following claims.

What is claimed is:

1. A circuit board comprising: a dielectric substrate, a grounding surface formed on at least one surface of the dielectric substrate, and transmission lines formed on one surface of the dielectric substrate for transmitting electrical signals, wherein at least a portion of each of the transmission lines is isolated from an upper surface of the dielectric substrate to reduce an effective permittivity between the transmission lines and the grounding surface and reduce dielectric loss; and further comprising a plurality of dielectric supporters for supporting the transmission lines, between the dielectric substrate and each of the transmission lines in order to isolate the transmission lines a predetermined interval apart from the upper surface of the dielectric substrate.

2. The circuit board of claim 1, further comprising a pad installed at least one end of each of the transmission lines.

3. The circuit board of claim 1, wherein each of the plurality of dielectric supporters is formed of a polymer to reduce electrical loss.

4. A circuit board comprising: a dielectric substrate, a grounding surface formed on at least one surface of the dielectric substrate, and transmission lines formed on one surface of the dielectric substrate for transmitting electrical signals, wherein at least a portion of each of the transmission lines is isolated from the upper surface of the dielectric substrate to reduce an effective permittivity between the transmission lines and the grounding surface and reduce dielectric loss, and a cap which covers the transmission lines, one end of the cap being grounded to the grounding surface; and further comprising a plurality of dielectric supporters for supporting the transmission lines, between the dielectric substrate and each of the transmission lines in order to isolate the transmission lines a predetermined interval apart from the upper surface of the dielectric substrate.

5. The circuit board of claim 4, wherein an inside of the cap is in a vacuum state.

6. The circuit board of claim 4, further comprising a pad installed at at least one end of each of the transmission lines.

7. The circuit board of claim 4, wherein each of the plurality of dielectric supporters is formed of a polymer to reduce electrical loss.

8. A circuit board comprising: a dielectric substrate, a grounding surface formed on at least one surface of the dielectric substrate, and transmission lines formed on one surface of the dielectric substrate for transmitting electrical signals, wherein at least a portion of each of the transmission lines is isolated from the upper surface of the dielectric substrate to reduce an effective permittivity between the transmission lines and the grounding surface and reduce dielectric loss, and a cap which covers the transmission lines, one end of the cap being grounded to the grounding surface;

and further comprising a plurality of supporters for supporting the transmission lines, between the dielectric substrate and each of the transmission lines in order to isolate the transmission lines a predetermined interval apart from the upper surface of the dielectric substrate, wherein an inside of the cap is in a vacuum state; and wherein the transmission lines are installed on one surface of the dielectric substrate, the grounding surface is formed on an opposite surface of the dielectric substrate, and a conducting electrode is installed, one end of which is connected to the cap and the other is grounded to the grounding surface through the dielectric substrate so that the cap is grounded to the grounding surface.

* * * * *